(12) United States Patent
Wu

(10) Patent No.: US 8,499,428 B2
(45) Date of Patent: Aug. 6, 2013

(54) METHOD OF REPAIRING AN ARRAY SUBSTRATE OF DISPLAY PANEL

(75) Inventor: Yen-Feng Wu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 125 days.

(21) Appl. No.: 13/039,270

(22) Filed: Mar. 2, 2011

(65) Prior Publication Data

US 2012/0084973 A1 Apr. 12, 2012

(30) Foreign Application Priority Data

Oct. 8, 2010 (TW) ................................ 99134443 A

(51) Int. Cl.
*B23P 6/00* (2006.01)

(52) U.S. Cl.
USPC ............................. 29/402.01; 29/825; 29/846

(58) Field of Classification Search
USPC ....................................... 29/825, 846, 402.01
See application file for complete search history.

(56) References Cited

U.S. PATENT DOCUMENTS

| | | | | |
|---|---|---|---|---|
| 5,834,321 A | * | 11/1998 | Salisbury | ........................ 438/4 |
| 6,753,935 B2 | | 6/2004 | Wu | |
| 7,098,983 B2 | | 8/2006 | Yee | |
| 7,187,423 B2 | * | 3/2007 | Ozaki et al. | ...................... 349/54 |
| 7,265,386 B2 | * | 9/2007 | Chen et al. | ...................... 257/59 |
| 7,304,692 B2 | * | 12/2007 | Shiau et al. | ...................... 349/54 |
| 2001/0026345 A1 | * | 10/2001 | Park et al. | ..................... 349/149 |
| 2005/0219437 A1 | * | 10/2005 | Te-Cheng | ....................... 349/54 |
| 2008/0158127 A1 | | 7/2008 | Chang | |
| 2009/0322977 A1 | | 12/2009 | Chung | |

FOREIGN PATENT DOCUMENTS

| | | |
|---|---|---|
| TW | I260693 | 8/2006 |
| TW | I282457 | 6/2007 |

* cited by examiner

*Primary Examiner* — Carl Arbes
(74) *Attorney, Agent, or Firm* — Winston Hsu; Scott Margo

(57) ABSTRACT

A method of repairing array substrate of display panel includes the following steps. An array substrate including a substrate, gate lines, data lines, common lines and repairing segments is provided. The gate lines and the data lines are intersected to define a plurality of pixel areas. The data lines include a first data line. The common lines include a first common line. The first data line has a broken line defect. A cutting process is performed to form a first cutting part and a second cutting part on the first common line, and thus the first common line between the first cutting part and the second cutting part forms a floating common repairing segment. A connecting process is performed to electrically connect the repairing segments, the first data line and the common repairing segment, so that the common repairing segment serves as a substitution line of the first data line.

9 Claims, 10 Drawing Sheets

METHOD OF REPAIRING AN ARRAY SUBSTRATE OF DISPLAY PANEL

BACKGROUND OF THE INVENTION

1. Field of the Invention

The present invention relates to an array substrate of a display panel and a method of repairing the same, and more particularly, to an array substrate of a display panel with low resistance-capacitance loading (RC loading) and high display quality, and a method of repairing the same.

2. Description of the Prior Art

Display panels, such as liquid crystal display panels, are mainly constructed by an array substrate, a color filter substrate, and liquid crystal molecules filled between the two substrates. A plurality of devices, such as a plurality of pixel areas arranged in array, gate lines, data lines, common lines, and thin film transistors, are disposed on the array substrate. As the application of liquid crystal display device prevails, the requirements for high resolution and high aperture ratio are also increased. In order to satisfy the specification of high resolution and high aperture ratio, the width of conducting lines has to be reduced and the density of conducting lines has to be increased. Under this condition, the probability of defects is also increased in the fabrication of gate lines, data lines or other conducting patterns of the array substrate. In order to save cost, repairing segments are normally disposed on the peripheral region of the array substrate in advance to repair the data lines or the gate lines. If the defects are repairable, the repairing segment can be used as a substitution line for the data line or the gate line having defect. However, because the repairing segments are disposed on the peripheral region of the array substrate, the RC loading of the repairing segment will increase due to its excessive long path. Once the repairing segment is used as the substitution line, the signal would be delayed and therefore the pixels would be recharged. Consequently, the quality of display is deteriorated. Furthermore, enough space should be maintained in the peripheral region of the array substrate for disposing the repairing segments, which makes it impossible to accomplish the design of slim boarder for the conventional liquid crystal display panel.

SUMMARY OF THE INVENTION

It is therefore one of the objectives of the present invention to provide an array substrate of a display panel and a method of repairing the same to decrease the RC loading of the repairing segment of the array substrate.

In accordance with an embodiment of the present invention, a method of repairing an array substrate of a display panel includes the following steps. First of all, an array substrate is provided. The array substrate includes a substrate, a first patterned conducting layer, a second patterned conducting layer, and a plurality of repairing segments. The first patterned conducting layer is disposed on the substrate, and the first patterned conducting layer comprises a plurality of gate lines. The second patterned conducting layer comprises a plurality of data lines and a plurality of common lines. The gate lines and the data lines are intersected and defining a plurality of pixel areas. The data lines comprise a first data line, the common lines comprise a first common line, and the pixel areas comprise a first pixel area, a second pixel area, and a third pixel area. The first pixel area, the second pixel area, and the third pixel area are disposed on a same side of the first data line, the first common line penetrates through the first pixel area, the second pixel area, and the third pixel area, and the first data line has a broken line defect disposed on a side of the first pixel area. The repairing segment is disposed respectively in each pixel area. A cutting process is performed to form a first cutting part on the first common line in the second pixel area and a second cutting part on the first common line in the third pixel area such that a floating common repairing segment is formed between the first cutting part and the second cutting part. A connecting process is performed to electrically connect the repairing segment of the second pixel area, the first data line, and the common repairing segment, and to electrically connect the repairing segment of the third pixel area, the first data line, and the common repairing segment such that the common repairing segment functions as a substitution line of the first data line.

In accordance with another embodiment of the present invention, an array substrate of a display panel includes a substrate, a first patterned conducting layer, a second patterned conducting layer, and a plurality of repairing segments. The first patterned conducting layer is disposed on the substrate and comprises a plurality of gate lines. The second patterned conducting layer is disposed on the substrate and comprises a plurality of data lines and a plurality of common lines. The gate lines and the data lines are intersected and arranged to define a plurality of pixel areas. The data line includes a first data line, the common line includes a first common line, and the pixel area includes a first pixel area, a second pixel area, and a third pixel area. The first pixel area, the second pixel area, and the third pixel area are disposed on a same side of the first data line, and the first pixel area is disposed between the second pixel area and the third pixel area. The first common line penetrates through the first pixel area, the second pixel area and the third pixel area, and the first data line has a broken line defect located on a side of the first pixel area. The repairing segments are disposed in each of the pixel areas, respectively. The first common line has a first cutting part in the second pixel area and a second cutting part in the third pixel area, and the first common line between the first cutting part and the second cutting forms a floating common repairing segment. In the second pixel area, the first data line is electrically connected to the common repairing segment through the repairing segment, and in the third pixel area, the first data line is electrically connected to the common repairing line through the repairing segment, so that the common repairing segment functions as a substitution line of the first data line.

The method of repairing an array substrate of a display panel of the present invention uses a part of the common line as the substitution line of the data line with a broken line defect so that the RC loading will not be increased and the display quality is effectively improved after repairing. Moreover, it is not necessary to reserve the layout space in the peripheral region for disposing the repairing lines, and therefore the design of slim boarder can be accomplished.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
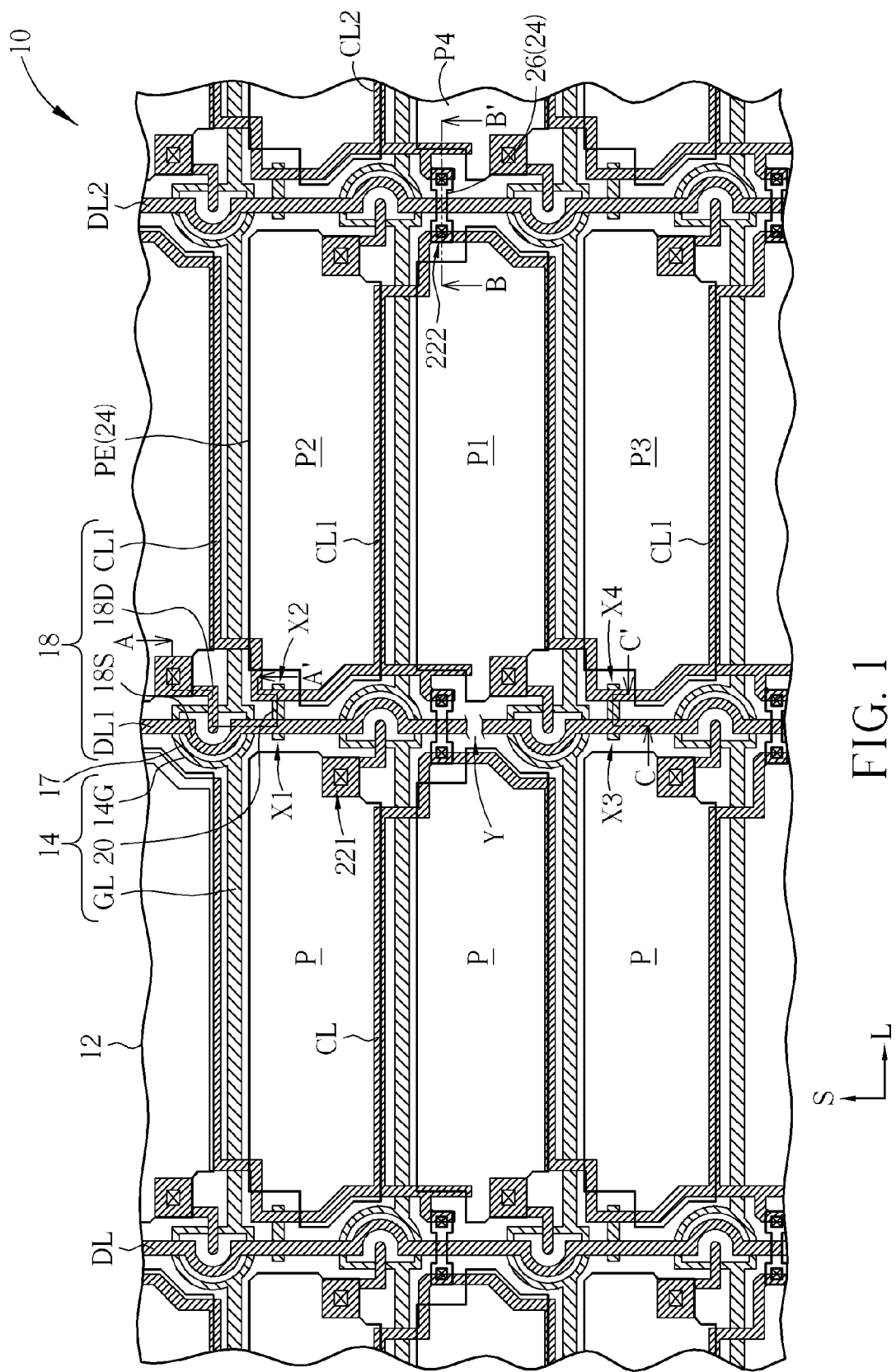
FIGS. 1-4 illustrate a method of repairing an array substrate of a display panel according to a first embodiment of the present invention.
Figure 2:
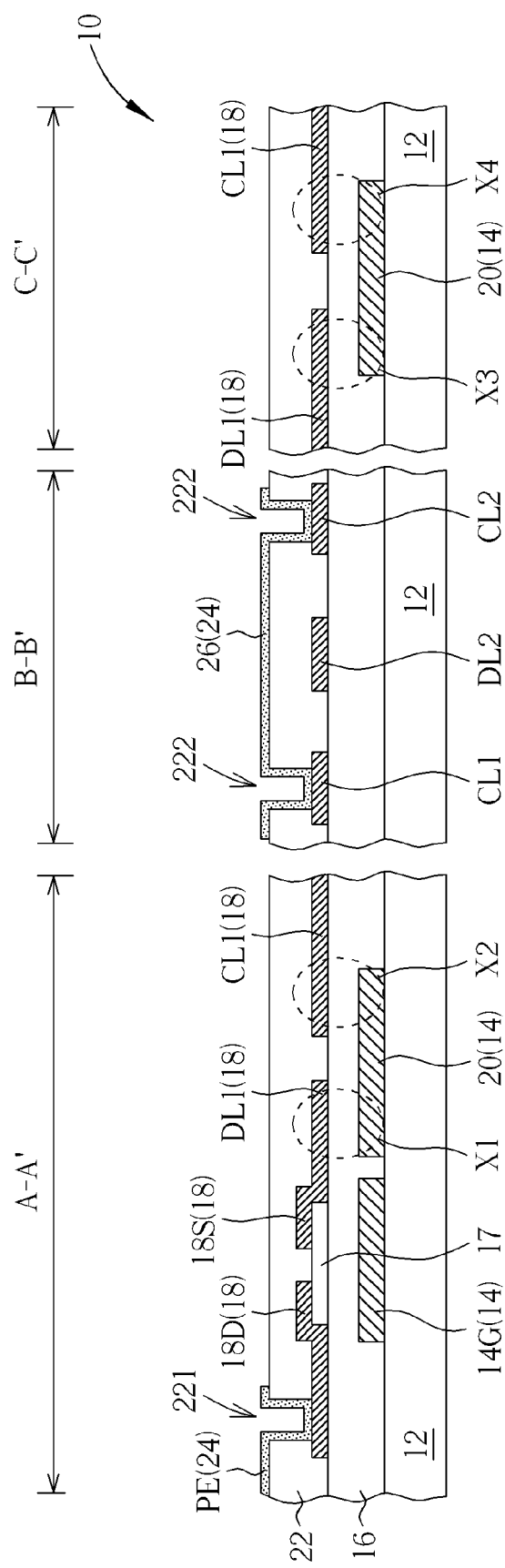
Figure 3:
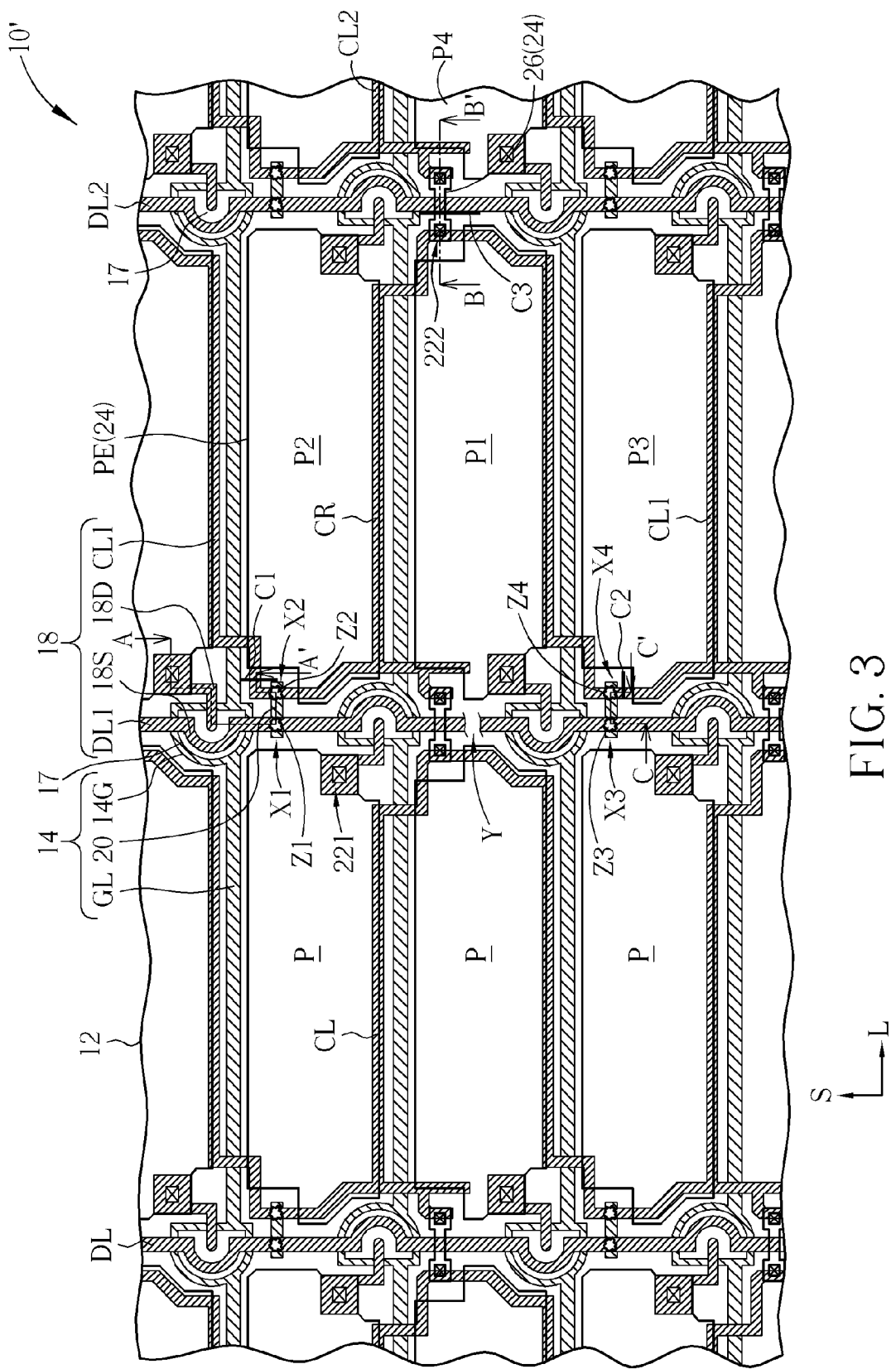
Figure 4:
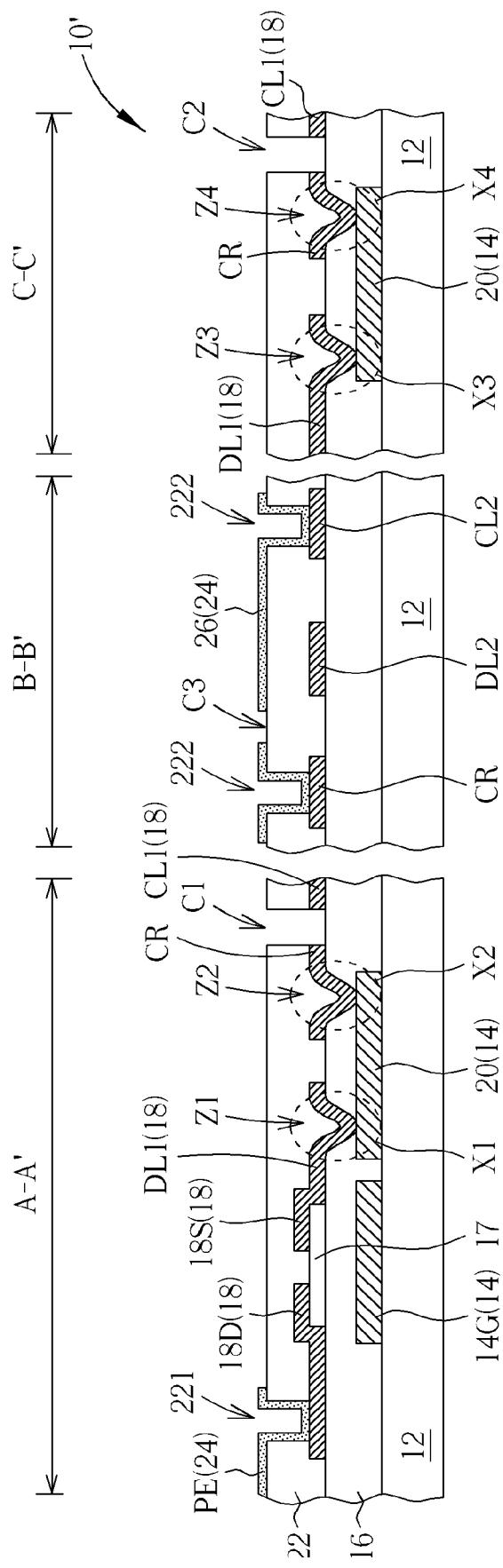

Please refer to FIGS. 1-4. FIGS. 1-4 illustrate a method of repairing an array substrate of a display panel according to a first embodiment of the present invention. FIG. 1 and FIG. 3 are top views of the array substrate of the display panel, FIG. 2 is a cross-sectional view of the array substrate of the display panel taken along lines A-A', B-B' and C-C' in FIG. 1, and FIG. 4 is a cross-sectional view of the array substrate of the display panel taken along lines A-A', B-B' and C-C' in FIG. 3. In this embodiment, the display panel could be any kinds of liquid crystal display panels. As shown in FIG. 1 and FIG. 2, an array substrate 10 (also known as thin film transistor substrate, TFT substrate) is provided. The array substrate 10 includes a substrate 12, a first patterned conducting layer 14, an insulated layer 16 (not shown in FIG. 1), a plurality of patterned semiconductor layer 17, a second patterned conducting layer 18, a plurality of repairing segments 20, a passivation layer 22 (not shown in FIG. 1), and a third patterned conducting layer 24. The substrate 12 could be a transparent substrate, such as a glass substrate, a quartz substrate, or a plastic substrate, but not limited thereto. The first patterned conducting layer 14 could be a patterned metal layer, and the materials could be, for instance, aluminum (Al), chromium (Cr), molybdenum (Mo), tungsten (W), tantalum (Ta), copper (Cu), or alloys thereof. The first patterned conducting layer 14 is disposed on the substrate 12, and the first patterned conducting layer 14 comprises a plurality of gate lines GL arranged substantially parallel to each other, and a plurality of gate electrodes 14G electrically connected to the corresponding gate line GL. The insulated layer 16, such as a silicon oxide layer, silicon nitride layer, or a silicon oxynitride layer, covers the substrate 12 and the first patterned conducting layer 14. The second patterned conducting layer 18 could be a patterned metal layer, and the materials could be, for instance, aluminum (Al), chromium (Cr), molybdenum (Mo), tungsten (W), tantalum (Ta), copper (Cu), or alloys thereof. The second patterned layer 18 is disposed on the substrate 12, on the insulated layer 16, and on the patterned semiconductor layer 17, and the second patterned conducting layer 18 comprises a plurality of data lines DL, a plurality of common lines CL, a plurality of source electrodes 18S, and a plurality of drain electrodes 18D. The data lines DL are arranged substantially parallel to each other, and the data lines DL and the gate lines GL are intersected, defining a plurality of pixel area P. Moreover, each of the source electrodes 18S and each of the drain electrodes 18D are disposed on two opposite sides of the corresponding gate electrode 14G, thereby forming a thin film transistor. The data line DL includes a first data line DL1 and a second data line DL2, and the common line CL includes a first common line CL1. The pixel area includes a first pixel area P1, a second pixel area P2, and a third pixel area P3. The first pixel P1, the second pixel area P2, and the third pixel area P3 are disposed on a same side of the first data line DL1, and the first pixel area P1 is disposed between the second pixel area P2 and the third pixel area P3. More specifically, the first pixel area P1, the second pixel area P2, and the third pixel area P3 are disposed between the first data line DL1 and the second data line DL2, the first pixel area P1 is driven by the first data line DL1, and the second pixel area P2 and the third pixel area P3 are driven by the second data line DL2. Moreover, the first common line CL1 penetrates through the first pixel area P1, the second pixel area P2, and the third pixel area P3.

In this embodiment, an array substrate of a liquid crystal display panel with tri-gate pixel structure is chosen as an example to illustrate the method of repairing the array substrate of the display panel of the present invention; however, the method of repairing the array substrate of the display panel of the present invention is not limited to repair an array substrate of a liquid crystal display panel with tri-gate pixel structure, but may be used to repair array substrates of all kinds of display panels. The tri-gate pixel structure is that when the resolution of the display panel is n*m, the number of the data lines DL is m and the number of the gate lines GL is 3n. In comparison with the display panel with single-gate pixel structure, the display panel with tri-gate structure uses more gate lines and less data lines, which can reduce the number of the source driving chips which is high cost and high power consuming. Moreover, in this embodiment, each pixel area P is a rectangular area and has a long axis L and a short axis S. The gate lines GL are substantially parallel to the long axis L of each pixel P, and the data lines DL are substantially parallel to the short axis S of each pixel area P.

In this embodiment, all of the common lines CL form a mesh pattern (grid pattern) structurally connected to each other. The pixel area P further includes a fourth pixel area P4, and the fourth pixel area P4 is disposed on a side of the first pixel area P1 and adjacent to the first pixel area P1. More specifically, the fourth pixel area P4 is disposed on the opposite side of the second data line D2 with respect to the first pixel area P1. The common line CL further includes a second common line CL2 disposed in the fourth pixel area P4. Moreover, because the data lines DL and the common lines CL are both a part of the second patterned conducting layer 18, the first common line CL1 and the second common line CL2 which are disposed on the two opposite sides of the data line DL are electrically connected to each other by using a bridging common line 26 made of another conducting layer.

The repairing segments 20 are disposed in each pixel area P, respectively. In this embodiment, the repairing segments 20 are a part of the first patterned conducting layer 14, i.e. the repairing segments 20, the gate lines GL, and the gate electrodes 14G are made of the same conducting layer, and the repairing segments 20 are electrically separated from the gate lines GL, but not limited thereto. For example, each repairing segment 20 could be electrically connected to the gate line GL, or the repairing segment 20 may not be a part of the first patterned conducting layer 14 but be made of a conducting layer differing from the first patterned conducting layer 14 and from the second patterned conducting layer 18, such as the third patterned conducting layer 24. Furthermore, in this embodiment, any two neighboring thin film transistors electrically connected to the same data line are used to drive the two pixel areas P disposed on the two opposite sides of the data line DL, but not limited thereto. For example, all the thin film transistors electrically connected to the same data line DL may be used to drive the pixel areas P disposed on the same side of the data line DL.

In this embodiment, the repairing segment 20 of the second pixel area P2 is preferable to partially overlap the first data line DL1 to form a first intersection X1, and to partially overlap the first common line CL1 to form a second intersection X2. The repairing segment 20 of the third pixel area P3 is preferable to partially overlap the first data line DL1 to form a third intersection X3, and to partially overlap the first common line CL1 to form a fourth intersection X4. It is profitable for the repairing of the first data line DL1 through the design of the intersections mentioned above, which will be elaborately described in the following passages.

The passivation layer 22 is disposed on the second patterned conducting layer 18, and the passivation layer 22 has a plurality of first openings 221 and a plurality of second openings 222. Each of the first openings 221 partially exposes each of the drain electrodes 18D, respectively, and each of the second openings 222 partially exposes a part of the common line CL, respectively. The third patterned conducting layer 24 could be a transparent patterned conducting layer, and the materials thereof could be, for instance, indium tin oxide (ITO), indium zinc oxide (IZO), and etc. The third patterned conducting layer 24 is disposed on the passivation layer 22, and the third patterned conducting layer 24 includes a plurality of pixel electrodes PE, which are disposed in each of the pixel areas P, respectively, and electrically connected to the corresponding drain electrode 18D through the corresponding first opening 221. In this embodiment, the bridging common line 26 for connecting neighboring common line CL could be a part of the third patterned conducting layer 24, that is to say, the bridging common line 26 is a transparent bridging common line and electrically connected to the corresponding common line CL through the second opening 222.

Next, a detecting process is performed on the array substrate 10 to confirm whether the array substrate 10 has any defect. If there are no defects, the following processes will be performed; otherwise, a repairing process will be performed. It is appreciated that the method of repairing the array substrate 10 of the present invention is substantially used for repairing the broken line defects. If the defect detected is a broken line defect, the repairing method of the present invention may be directly performed. If the defect detect is a short defect, the short defect could be cut into a broken line defect, and then repaired by the repairing method of the present invention. A broken line defect Y which is detected on the first data line DL1 disposed on a side of the first pixel area P1 is taken as an example to describe the method of repairing the array substrate of the present invention as follows.

As shown in FIG. 3 and FIG. 4, when a broken line defect Y of the first data line DL1 disposed on a side of the first pixel area P1 is detected, a repairing process is performed. The repairing process includes a cutting process and a connecting process. The cutting process is performed to form a first cutting part C1 on the first common line CL1 in the second pixel area P2 and to form a second cutting part C2 on the first common line CL1 in the third pixel area P3. Moreover, a third cutting part C3 is formed on the bridging common line 26 to cut off the electrical connection between the first common line CL1 and the second common line CL2 to make the first common line CL1 between the first cutting part C1 and the second cutting part C2 form a floating common repairing segment CR. In other words, the common repairing segment CR is electrically separated from the first common line CL1 and from the second common line CL2. In this embodiment, the cutting process could be a laser cutting process, which uses laser beam to forms a cutting part, but not limited thereto. Furthermore, the connecting process is performed to electrically connect the repairing segment 20 of the second pixel area P2, the first data line D1, and the common repairing segment CR and to electrically connect the repairing segment 20 of the third pixel area P3, the first data line DL1, and the common repairing segment CR. As described, because each of the repairing segments 20 respectively partially overlaps the data lines DL and the common lines CL, the connecting process could be a laser welding process, which uses laser beam to electrically connect the repairing segment 20 and the first data line DL1 in the first intersection X1 to form a first node Z1, to electrically connect the repairing segment 20 and the first common line CL1 in the second intersection X2 to form a second node Z2, to electrically connect the repairing segment 20 and the first data line DL in the third intersection X3 to form a third node Z3, and to electrically connect the repairing segment 20 and the first common line CL1 in the fourth intersection X4 to form a first node Z4. It is appreciated that, in other embodiments, each of the repairing segments 20 is not limited to partially overlap the data lines DL and the common lines CL. Under this condition, the connecting process could be, for instance, a laser vapor deposition process, which may deposit the patterned conducting layer to connect the repairing segment 20 and the first data line DL and to connect the repairing segment 20 and the first common line CL1.

After performing the method of repairing the array substrate of the display panel mentioned above, the repaired array substrate 10' may operate normally. The repaired array substrate 10' is then assembled with another substrate (not shown), such as a color filter substrate, and liquid crystal molecules (not shown) may be formed between the two substrates to form a display panel of this embodiment. The common repairing segment CR could be a substitution line (as shown by the arrow in FIG. 3) for the first data line DL1 after the repair. Accordingly, the signal of the first data line DL1 could be transferred through the substitution line formed by the common repairing segment CR, and thus normal display function can be implemented.

The method of repairing the array substrate of the display panel of the present invention and the repaired array substrate of the display panel are not limited to the embodiment mentioned above, and other embodiments and variation embodiments of the present invention will be described below. In order to compare the differences between the embodiments and to describe briefly, same components are denoted by same numerals, and repeated parts are not redundantly described.

Figure 5:
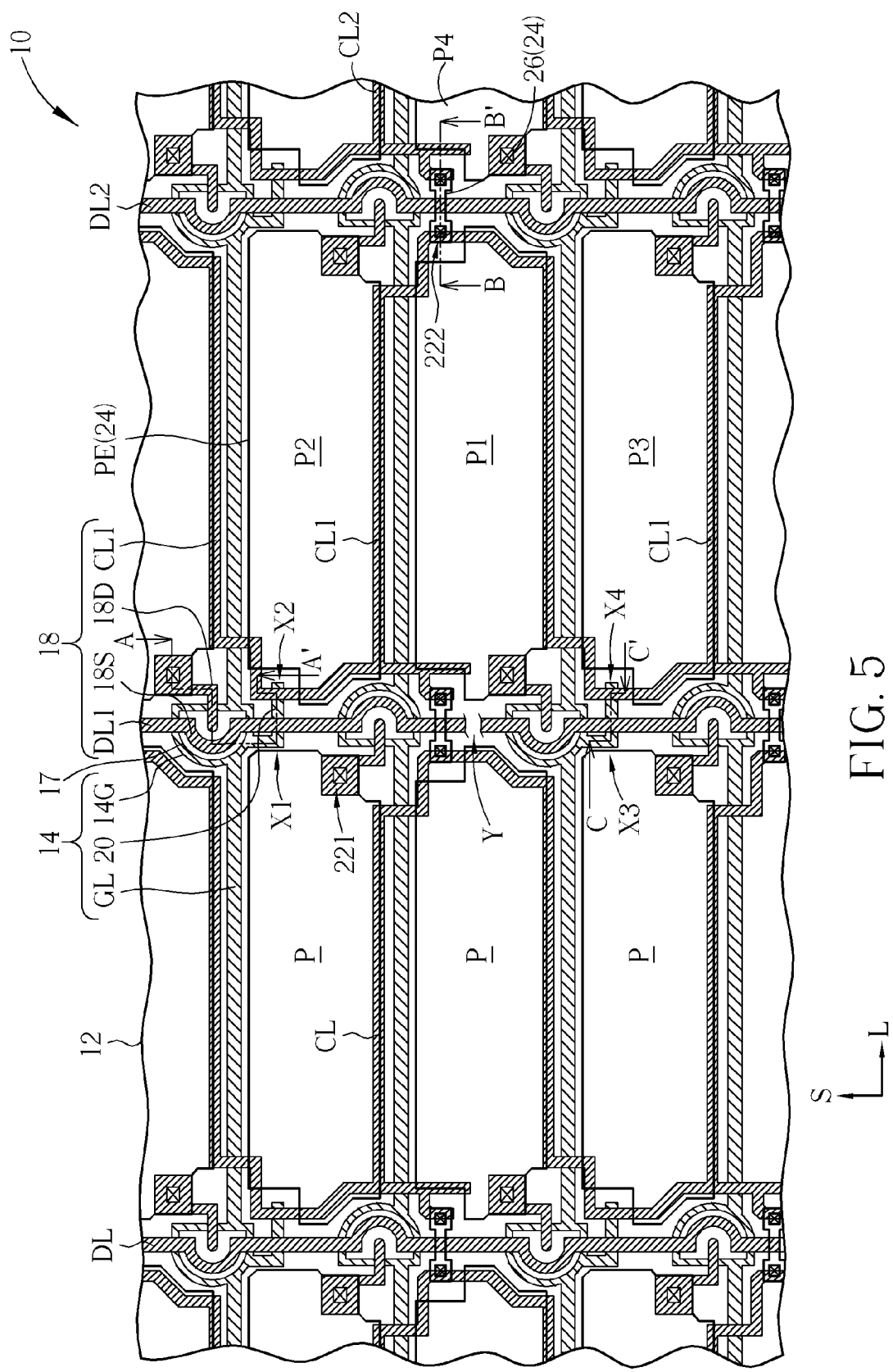
FIGS. 5-8 illustrate a method of repairing the array substrate of the display panel according to a second preferred embodiment of the present invention.
Figure 6:
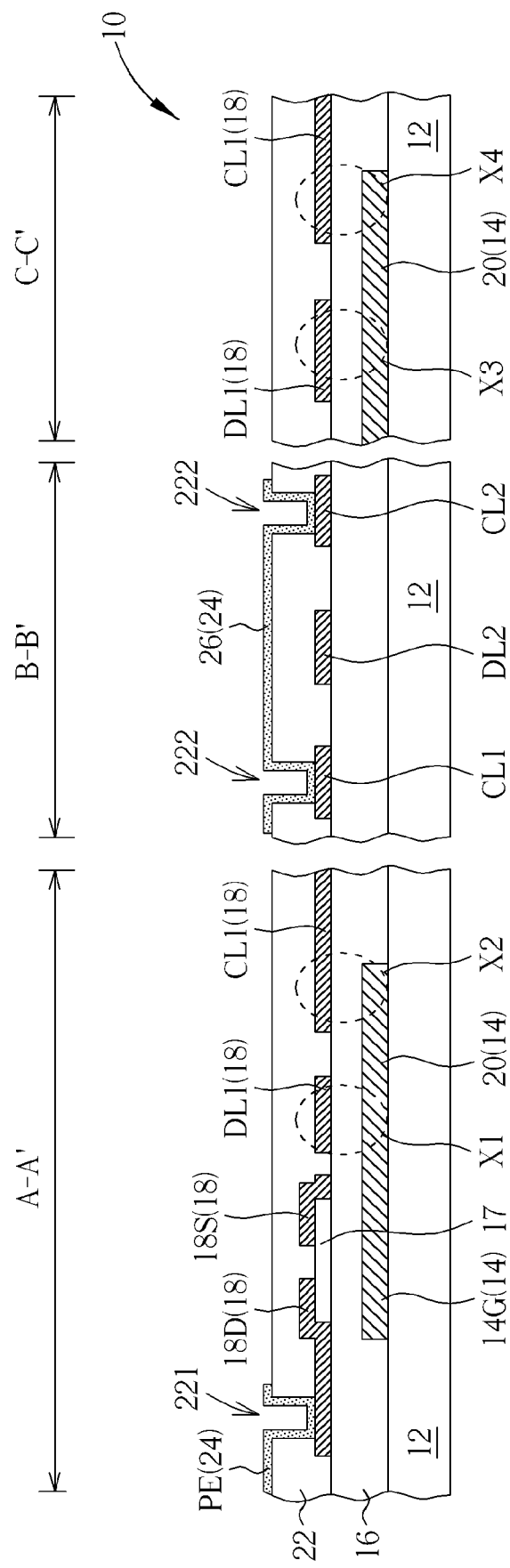
Figure 7:
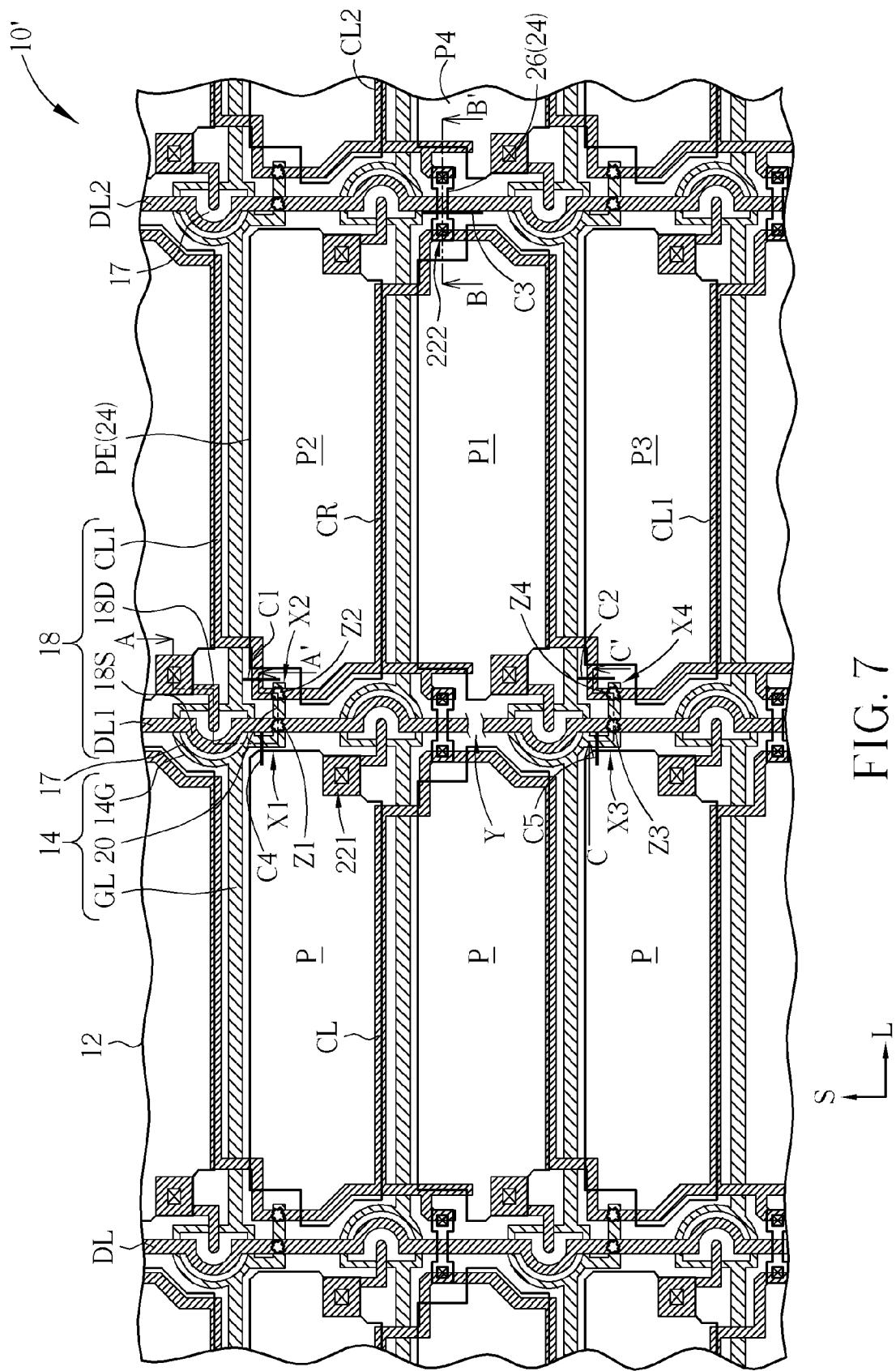
Figure 8:
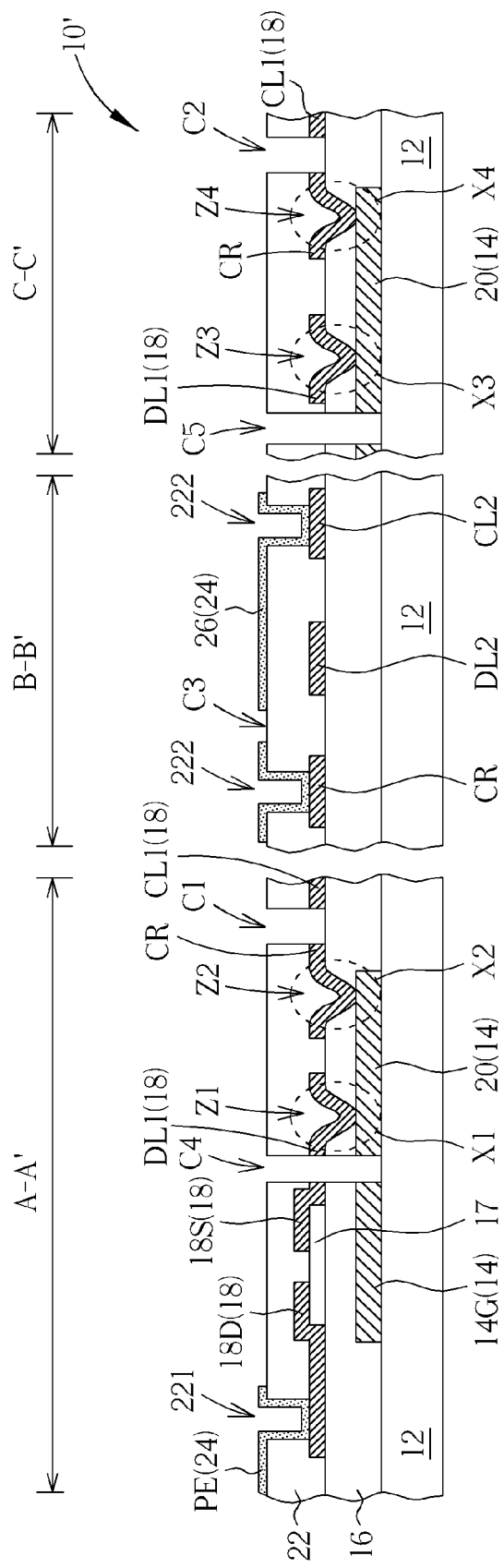

Please refer to FIGS. 5-8. FIGS. 5-8 illustrate a method of repairing the array substrate of the display panel according to a second preferred embodiment of the present invention. FIG. 5 and FIG. 7 are top views of the array substrate of the display panel, FIG. 6 is a cross-sectional view of the array substrate of the display panel taken along lines A-A', B-B' and C-C' in FIG. 5, and FIG. 8 is a cross-sectional view of the array substrate of the display panel taken along lines A-A', B-B' and C-C' in FIG. 7. As shown in FIG. 5 and FIG. 6, an array substrate 10 is provided. Different from the first preferred embodiment, each of the repairing segments 20 is a part of the first patterned conducting layer 14 in this embodiment, and the repairing segment 20 is electrically connected to the corresponding gate line GL, respectively. As shown in FIG. 7 and FIG. 8, in this embodiment, because the repairing segment 20 is electrically connected to the gate lines GL, in addition to the first cutting part C1, the second cutting part C2 and the third cutting part C3, the cutting process further includes forming a forth cutting part C4 to break the electrical connection between the repairing segment 20 of the second pixel area P2 and the corresponding gate line GL, and forming a fifth cutting part C5 to break the electrical connection between the repairing segment 20 of the third pixel area P3 and the corresponding gate line GL.

Similarly, according to the repairing method mentioned above, a repaired array substrate 10' of the present invention is formed. The common repairing segment CR could be a substitution line for the first data line DL1 after the repair.

Accordingly, the signal of the first data line DL1 could be transferred through the substitution line formed by the common repairing segment CR, and thus normal display function can be implemented.

Figure 9:
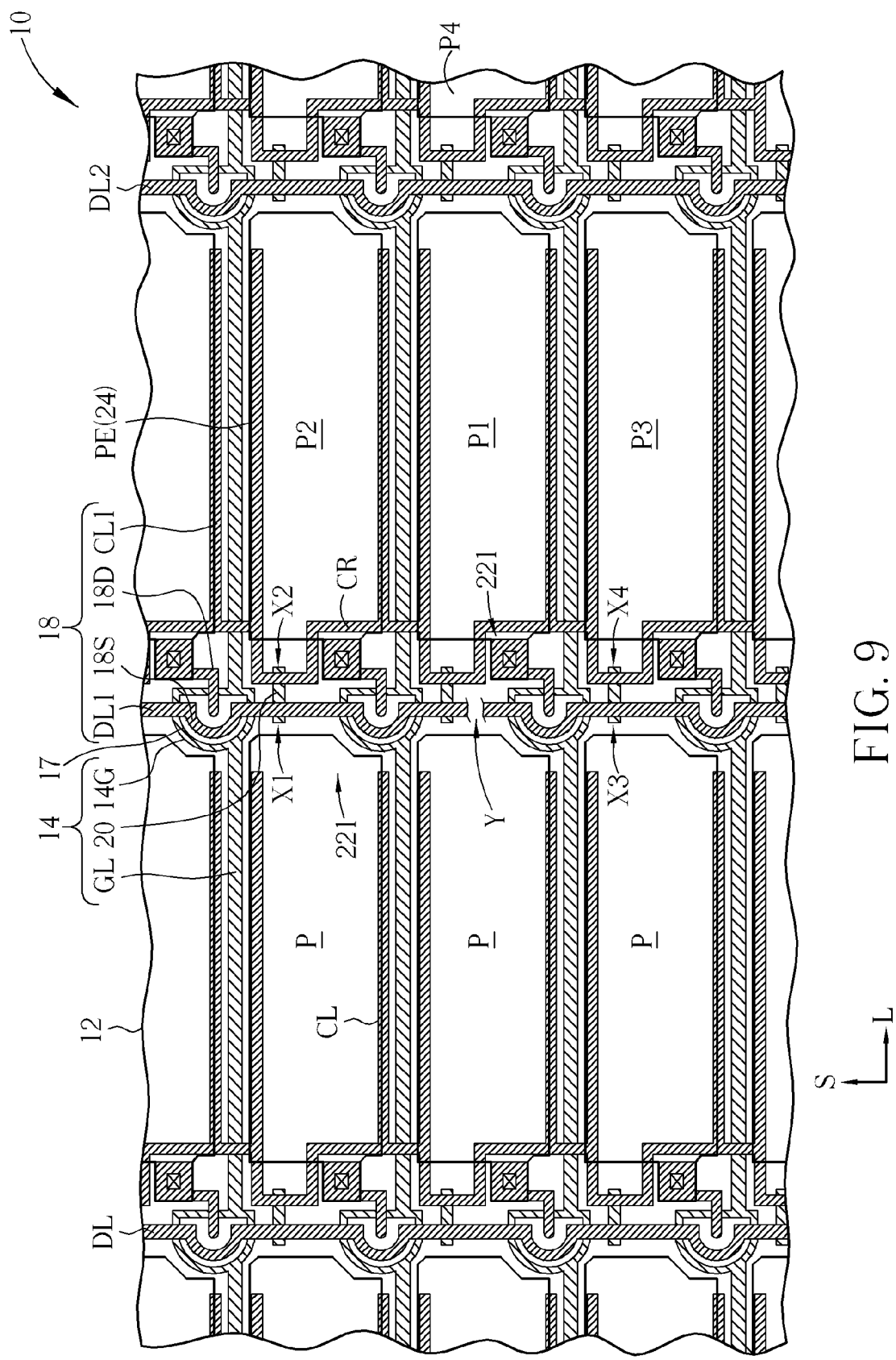
FIG. 9 and FIG. 10 illustrate a method of repairing an array substrate of a display panel according to a third preferred embodiment of the present invention.
Figure 10:
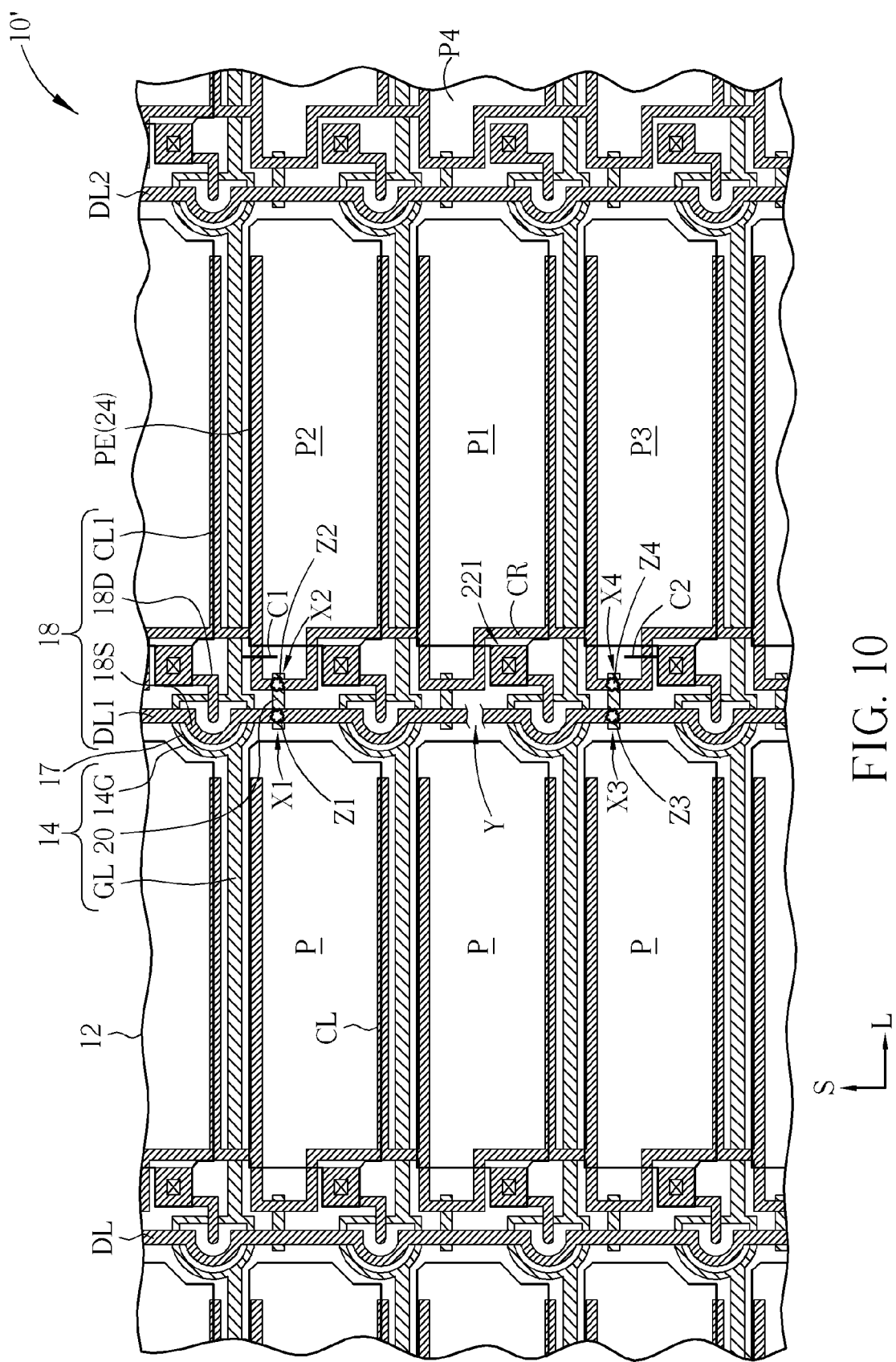

In the two embodiments mentioned above, any two neighboring thin film transistors electrically connected to the same data line DL are used to drive the two pixel areas P disposed on the two opposite sides of the data line DL, respectively, and all of the common lines CL form a mesh pattern (grid pattern) structurally connected to each other. The present invention, however, is not limited thereto. Please refer to FIG. 9 and FIG. 10. FIG. 9 and FIG. 10 illustrate a method of repairing an array substrate of a display panel according to a third preferred embodiment of the present invention. As shown in FIG. 9, an array substrate 10 is provided. Different from the first and second preferred embodiments, all of the thin film transistors electrically connected to the same data line DL are used to drive the pixel areas P disposed on the same side of the data line DL in this embodiment. For example, the three thin film transistors used to drive the first pixel area P1, the second pixel area P2, and the third pixel area P3 are electrically connected to the first data line DL1. In addition, the common lines CL have a plurality of C-shaped pattern disposed in each of the pixel areas P, respectively, and the common line CL disposed in the pixel areas P of the same column is not electrically connected to the common line CL disposed in the pixel areas P of the neighboring column, but not limited thereto. It is appreciated that in this embodiment, each of the repairing segments 20 is a part of the first patterned conducting layer 14, and is not electrically connected to the gate lines GL (which is similar to the configuration of the first embodiment), but is not limited thereto. For instance, each of the repairing segments 20 may be electrically connected to the corresponding gate line GL, respectively (which is similar to the configuration of the second embodiment).

As shown in FIG. 10, when a broken line defect Y is detected in the first data line DL1 disposed on a side of the first pixel area P1, a repairing process is performed. The repairing process includes a cutting process and a connecting process. The cutting process is performed to form a first cutting part C1 on the first common line CL1 in the second pixel area P2 and to form a second cutting part C2 on the first common line CL1 in the third pixel area P3, so that the first common line CL1 between the first cutting part C1 and the second cutting part C2 forms a floating common repairing segment CR. In this embodiment, because the common lines CL do not form a mesh pattern, it is not necessary to form a third cutting part. Moreover, a connecting process is performed to electrically connect the repairing segment 20 of the second pixel area P2, the first data line DL1 and the common repairing segment CR, and to electrically connect the repairing segment 20 of the third pixel area P3, the first data line DL1, and the common repairing segment CR.

After performing the method of repairing the array substrate of the display panel mentioned above, a repaired array substrate 10' of the present invention is formed. The common repairing segment CR could be a substitution line for the first data line DL1 after the repair. Accordingly, the signal of the first data line DL1 could be transferred through the substitution line formed by the common repairing segment CR, and thus normal display function can be implemented.

In conclusion, the method of repairing an array substrate of a display panel of the present invention uses a part of the common line as a substitution line for the data line with a broken line defect, so that the RC loading would not be increased and the display quality of the repaired display panel is effectively improved. Furthermore, it is not necessary to reserve the layout space in the peripheral region for disposing the repairing lines, and therefore the design of slim boarder can be accomplished.

Those skilled in the art will readily observe that numerous modifications and alterations of the device and method may be made while retaining the teachings of the invention.

What is claimed is:

1. A method of repairing an array substrate of a display panel, comprising:
   providing an array substrate, the array substrate comprising:
      a substrate;
      a first patterned conducting layer disposed on the substrate, the first patterned conducting layer comprising a plurality of gate lines;
      a second patterned conducting layer disposed on the substrate, the second patterned conducting layer comprising a plurality of data lines and a plurality of common lines, wherein the data lines intersect the gate lines to define a plurality of pixel areas, the data lines comprise a first data lines, the common lines comprise a first common line, the pixel areas comprise a first pixel area, a second pixel area and a third pixel area, the first pixel area, the second pixel area and the third pixel area are disposed on a same side of the first data line, the first pixel area is disposed between the second pixel area and the third pixel area, the first common line penetrates through the first pixel area, the second pixel area and the third pixel area, and the first data line has a broken line defect located on a side of the first pixel area; and
      a plurality of repairing segments disposed in each of the pixel areas;
   performing a cutting process to form a first cutting part on the first common line in the second pixel area, and to form a second cutting part on the first common line in the third pixel area, so that a floating common repairing segment is formed between the first cutting part and the second cutting part; and
   performing a connecting process to electrically connect the repairing segment of the second pixel area, the first data line and the common repairing segment, and to electrically connect the repairing segment of the third pixel area, the first data line and the common repairing segment, so that the common repairing segment is served as a substitution line of the first data line.

2. The method of repairing the array substrate of the display panel according to claim 1, wherein the pixel areas further comprise a fourth pixel area, the fourth pixel area is disposed adjacent to the first pixel area and does not share the first data line with the first pixel area, the common lines further comprise a second common line disposed in the fourth pixel area, and a bridging common line electrically connected to the first common line of the first pixel area and the second common line of the fourth pixel area, and the cutting process further comprises forming a third cutting part on the bridging common line to cut off an electrical connection between the first common line and the second common line.

3. The method of repairing the array substrate of the display panel according to claim 2, wherein the bridging common line comprises a transparent bridging common line.

4. The method of repairing the array substrate of the display panel according to claim 1, wherein the repairing segments are a part of the first patterned conducting layer.

5. The method of repairing the array substrate of the display panel according to claim 2, wherein each of the repairing segments is electrically connected to one of the gate lines, and the cutting process further comprises forming a fourth cutting part to cut off an electrical connection between the repairing segment of the second pixel area and the corresponding gate line, and forming a fifth cutting part to cut off an electrical connection between the repairing segment of the third pixel area and the corresponding gate line.

6. The method of repairing the array substrate of the display panel according to claim 1, wherein the cutting process comprises a laser cutting process.

7. The method of repairing the array substrate of the display panel according to claim 1, wherein the repairing segment of the second pixel area partially overlaps the first data line to form a first intersection, the repairing segment of the second pixel area partially overlaps the first common line to form a second intersection, the repairing segment of the third pixel area partially overlaps the first data line to form a third intersection, and the repairing segment of the third pixel area partially overlaps the first common line to form a fourth intersection.

8. The method of repairing the array substrate of the display panel according to claim 7, wherein the connecting process comprises performing a laser welding process to electrically connect the repairing segment and the first data line disposed in the first intersection to form a first node, to electrically connect the repairing segment and the first common line disposed in the second intersection to form a second node, to electrically connect the repairing segment and the first data line disposed in the third intersection to form a third node, and to electrically connect the repairing segment and the first common line disposed in the fourth intersection to form a fourth node.

9. The method of repairing the array substrate of the display panel according to claim 1, wherein each of the pixel areas is a rectangular area having a long axis and a short axis, and the gate lines are substantially parallel to the long axis of each of the pixel areas.

* * * * *